United States Patent [19]
Leonard et al.

[11] Patent Number: 5,930,604
[45] Date of Patent: Jul. 27, 1999

[54] ENCAPSULATION METHOD FOR FINE-PITCH CHIP-ON-BOARD

[75] Inventors: Jay F. Leonard; Yanshu Chen, both of Kokomo, Ind.

[73] Assignee: Delco Electronics Corporation, Kokomo, Ind.

[21] Appl. No.: 09/017,435

[22] Filed: Feb. 2, 1998

[51] Int. Cl.$^6$ ................................................. H01L 21/44
[52] U.S. Cl. ........................................... 438/127; 438/126
[58] Field of Search .................................. 438/124, 126, 438/127

[56] References Cited

U.S. PATENT DOCUMENTS

| | | | |
|---|---|---|---|
| 5,026,669 | 6/1991 | Shinohara | 438/124 |
| 5,371,044 | 12/1994 | Yoshida et al. | 438/124 |
| 5,474,958 | 12/1995 | Djennas et al. | 438/124 |
| 5,700,697 | 12/1997 | Dlugokecki | 438/124 |
| 5,763,296 | 6/1998 | Casati et al. | 438/127 |
| 5,831,833 | 11/1998 | Shirakawa et al. | 438/126 |

*Primary Examiner*—Kevin M. Picardat
*Attorney, Agent, or Firm*—Jimmy L. Funke

[57] ABSTRACT

A process for depositing an encapsulating material (16) on and around a COB die (10) and other wire-bonded device, without producing voids that encourage premature fatigue fracturing of the material (16) and wires (14) that electrically connect the device (10) to a circuit board (12). The process generally entails mounting and wire bonding a die (10) to a circuit board (12) with multiple bond wires (14). The encapsulation material (16) is then deposited along a first edge (18) of the die, and sequentially along the remaining edges (20, 22, 24) of the die (10), each successive edge being contiguous with the preceding edge, until the entire perimeter of the die (10) is surrounded and contacted with the material (16). The encapsulation material (16) encapsulates only those portions of the wires (14) immediately adjacent the die (10), with the remainder of the wires (14) remaining exposed. The material (16) is then sequentially deposited along two separate serpentine paths (26, 28), each of which initially crosses the die (10) near its geometric center, and thereafter continues toward opposite edges of the die (10). The material (16) deposited along the serpentine paths (26, 28) encapsulates the entire die (10) and its bond wires (14).

9 Claims, 2 Drawing Sheets

ENCAPSULATION METHOD FOR FINE-PITCH CHIP-ON-BOARD

FIELD OF THE INVENTION

The present invention generally relates to techniques for improving thermal cycle fatigue life of integrated circuit components. More particularly, this invention relates to a process for encapsulating integrated circuit components, such as a chip-on-board (COB) integrated circuit (IC). The process entails dispensing an encapsulation material around and over an IC die in a manner that prevents the formation of voids in the encapsulation material as it is deposited, which improves reliability and resistance to thermal cycle fatigue.

BACKGROUND OF THE INVENTION

Chip-on-board (COB) is a form of integrated circuit (IC) well known in the art. A COB is generally an IC chip attached with an adhesive to a substrate, such as a circuit board, with wires electrically interconnecting the chip to conductors on the substrate. The wires and the interconnection are typically formed using wire bonding techniques, in which very thin electrically-conductive wires, often on the order of about 0.25 millimeter or less in diameter, are bonded to leads on the chip and to bond pads on the substrate. Suitable wire bonds can be achieved with various wire bonding techniques, including thermosonic and ultrasonic bonding.

It is well known to encapsulate a COB die and its wires with an encapsulation material that immobilizes the wires to prevent shorting between adjacent wires and to generally form a protective shell over and around the COB. Encapsulation materials for COBs and other IC devices are often one or two-part epoxies containing a glass filler to reduce the CTE of the material to a value closer to that of the die and circuit board. Reducing the CTE of the encapsulant in this manner reduces the adverse impact that the encapsulant has on the thermal cycle fatigue life of the wire bonds made between each wire and the circuit board and each wire and its bond pad which, during temperature excursions, are subject to thermal stresses as a result of differences in coefficients of thermal expansion (CTE) of the various materials that form the chip, substrate and encapsulant. These thermal stresses can fatigue and fracture the wires at the bond interface, particularly if the assembly is subject to many temperature excursions, high temperatures on the order of 125° C. or more, or intense vibration, all of which are often encountered in automotive and aerospace electronic applications.

Because gaps on the order of about 0.15 millimeter or less are typical between the wires and chip, there is a tendency for non-uniform flow of the encapsulation material, causing void formation as a result of air being trapped within the material. If a void is present, the thermal cycle fatigue life of the COB can be significantly limited due to the void creating a region of high stress concentration. A notable failure mode is for the encapsulation material to delaminate from the chip due to the presence of a void adjacent the chip.

Various deposition techniques have been employed to deposit encapsulants for COBs, some of which are illustrated in FIGS. 2 through 4, which illustrate an inward spiral (FIG. 2), outward spiral (FIG. 3) and serpentine (FIG. 4) paths 110 along which an encapsulation material has been deposited to encapsulate a COB chip 112. However, these techniques have not eliminated the formation of voids in the encapsulant, even when various deposition parameters have been modified, including flow rate, line speed, volume, material temperature, needle size, and distance between deposition needle and substrate. A deposition technique that has been used to reduce void formation entails the use a two-part encapsulant. One of the encapsulant materials is formulated to be more viscous, and then deposited to form a peripheral dam around the COB chip and its bond wires, while the second material is formulated to be thinner, and then used to penetrate and fill the gaps between the wires and chip. A drawback to this approach is that the technique complicates processing and increases costs.

As a result of the above, the use of COBs has been largely limited to consumer electronic applications (whose temperature extremes for thermal cycle fatigue testing are typically 0° C. and 80° C.), and not to more demanding automotive and aerospace applications (whose temperature extremes for thermal cycle fatigue testing are typically −40° C. and +125° C.). However, it would be advantageous if COBs could be employed in the automotive and aerospace industries. The processing of such COBs would preferably be amenable to in-line processes, and employ an encapsulation material that does not complicate the assembly process.

SUMMARY OF THE INVENTION

According to the present invention, a process is provided for depositing an encapsulating material on and around a COB die and other wire-bonded devices, without producing voids that encourage premature fatigue fracturing of the encapsulating material and wires that electrically connect such devices to a circuit board. According to the invention, the process is amenable to in-line processing methods, and employs a conventional one-part encapsulant.

The process of this invention generally entails mounting a COB IC or another IC die to a circuit board, and wiring bonding the die to the board with multiple bond wires that extend radially outward from the edges of the die and electrically connect the die to the circuit board. An encapsulation material is then deposited along a first edge of the die, and sequentially along the remaining edges of the die, each successive edge being contiguous with the preceding edge, until the entire perimeter of the die is surrounded and contacted with the material. In so doing, the encapsulation material encapsulates only those portions of the wires immediately adjacent the chip, with the remainder of the wires remaining exposed. After allowing the encapsulation material to settle and flow downwardly between the wires and along the edges of the die, the encapsulation material is deposited along a first serpentine path that initially crosses the die near its geometric center, and thereafter continues toward one of the edges of the die. The encapsulation material is then deposited along a second serpentine path that also initially crosses near the center of the die, but then continues toward the opposite edge of the die. In so doing, the material deposited along the serpentine paths encapsulates the wires and covers the entire die.

According to this invention, encapsulation materials deposited in accordance with the above are able to completely encapsulate an IC die and its bond wires without trapping air that forms voids within the encapsulant. As such, the thermal cycle fatigue resistance of the IC die, encapsulant and wires is drastically improved. The result is greater reliability in terms of fatigue life.

Other objects and advantages of this invention will be better appreciated from the following detailed description.

BRIEF DESCRIPTION OF THE DRAWING

The above and other advantages of this invention will become more apparent from the following description taken in conjunction with the accompanying drawings, in which.

DETAILED DESCRIPTION OF THE INVENTION

Figure 1:
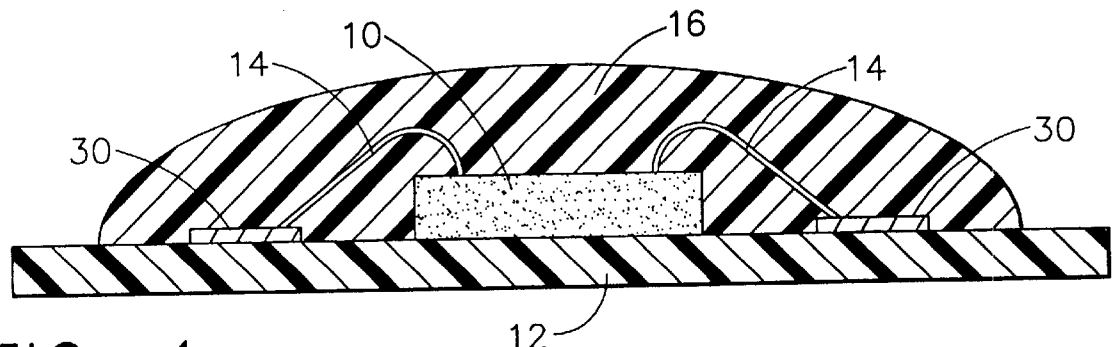
FIG. 1 is a cross-sectional view of an encapsulated COB.

As illustrated in FIG. 1, a chip-on-board (COB) die 10 is shown adhered to a circuit board 12, such as with an adhesive. In addition, the die 10 is electrically interconnected to bond pads 30 on a circuit board 12 with thin bond wires 14, typically aluminum or gold on the order of about 0.03 to about 0.127 millimeter in diameter. The die 10 and its bond wires 14 are shown as being completely encapsulated with an encapsulant 16 in order to prevent shorting between adjacent wires 14 and to generally protect the assembly from damage. In accordance with this invention, the reliability of the die 10 and its wires 14 is promoted by the manner in which the encapsulant 16 is formed, and more particular the manner in which the encapsulating material is deposited in and around the die 10 and wires 14.

While the invention will be described in reference to a conventional COB as represented in FIG. 1, the teachings of this invention are not limited to the specific configuration shown, and those skilled in the art will recognize that numerous variations of the illustrated electronic assembly are possible, all of which are within the scope of this invention.

As is known in the art, when properly applied the encapsulant 16 serves to protect the wires 14 from damage due to handling and vibration. To reduce the adverse effect of a CTE mismatch between the encapsulant 16 and the COB die 10 and substrate 12, the encapsulant 16 is preferably formulated to contain fillers that lower its CTE to a value closer to that of the die 10 and substrate 12. However, voids within the encapsulant 16 can serve as stress concentrators, which promote thermal cycle fatigue fracturing of the wires 14 and delamination of the encapsulant 16 at the chip-encapsulant or encapsulant-substrate interfaces. To prevent the formation of voids, adequate distribution of the encapsulant 16 in and around the die 10 and wires 14 is essential. According to this invention, commercially available encapsulating materials can be used to successfully encapsulate a die 10 and its bond wires 14 if deposition occurs in a specified manner. A suitable material for the encapsulant 16 is a one-part epoxy, i.e., a single epoxy instead of a mixture of epoxies, that contains a filler material and a curative that triggers curing at an elevated temperature, though it is foreseeable that other types of curatives could be used. The filler material may be any suitable substance capable of yielding the desired flow, electrical, mechanical and thermal properties for the encapsulation material. A preferred encapsulating material has a sufficiently low viscosity, generally not more than about 5000 centipoise, at the desired dispensing temperature in order for the material to flow freely between the wires 14, and has a CTE when cured within about 50 percent of that of the die 10 and circuit board 12 in order to avoid an excessive thermal mismatch. In addition, the encapsulant 16 must be suitable for the intended environment of the electronic assembly, which generally necessitates a relatively low density, high modulus and fracture toughness, and some degree of resistance to chemical attack and elevated temperatures. An example of a preferred encapsulating material is CNB 660-40, available from Dexter/Hysol. This material has a viscosity of about 3000 at an encapsulation temperature of about 50° C., and cures at a temperature of about 130° C. to 150° C.

Figure 5:
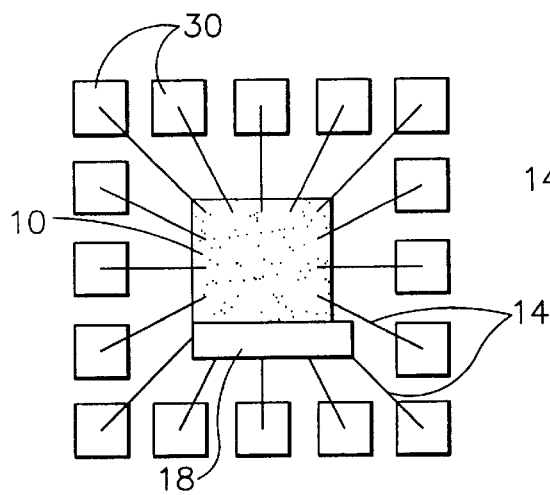
FIGS. 5 through 10 illustrate an encapsulation process in accordance with a preferred embodiment of this invention.
Figure 6:
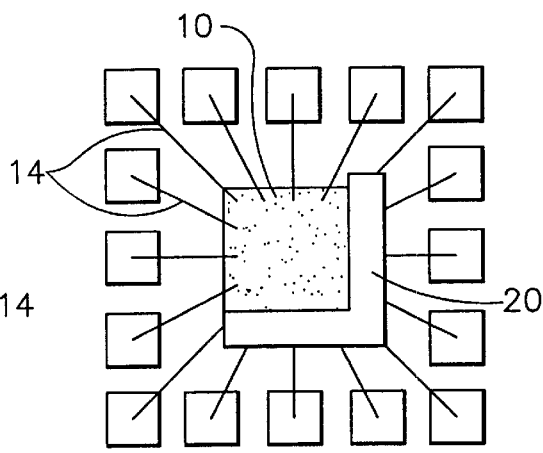
Figure 7:
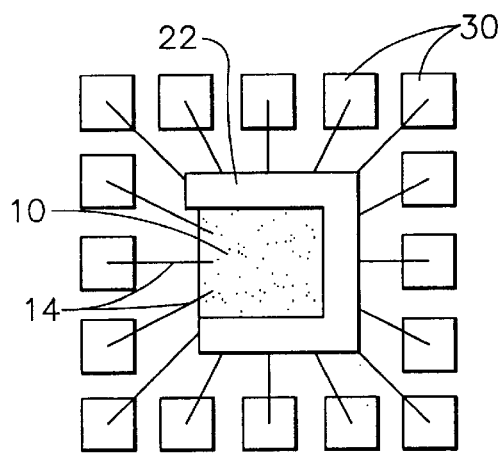
Figure 8:
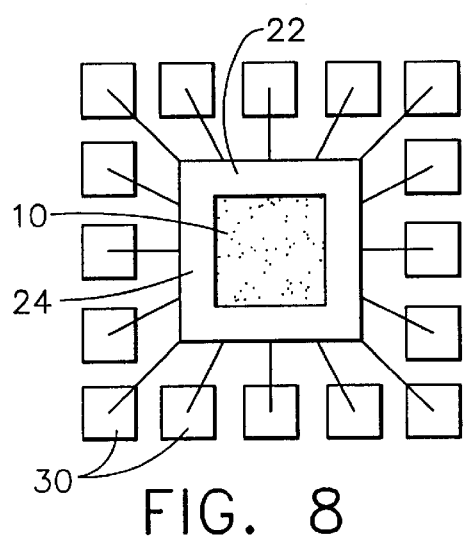

According to the present invention, encapsulating materials having the above characteristics can be used to completely encapsulate a die 10 and its wires 14 if dispensed in accordance with the steps shown in FIGS. 5 through 10. As shown in FIG. 5, encapsulation of the die 10 begins with the deposition of the encapsulating material along a single edge 18 of the die 10, such that the material fills the region between the wires 14 immediately adjacent the die 10. Thereafter, the encapsulating material is dispensed along a contiguous edge 20 of the die 10 in a similar manner, as shown in FIG. 6. The encapsulating material is the dispensed along the next contiguous edge 22 as shown in FIG. 7, after which the encapsulating material is dispensed along the remaining edge 24 of the die 10, such that the entire perimeter of the die 10 is now contacted by the encapsulating material as shown in FIG. 8.

Figure 9:
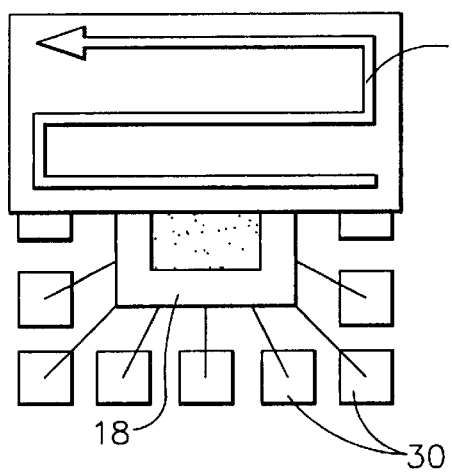
Figure 10:
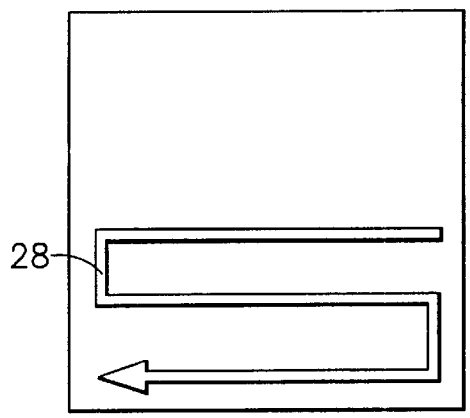

The next steps shown in FIGS. 9 and 10 are preferably carried out after allowing the encapsulating material to settle between the wires 14 and against the die 10. Generally, a period of about fifteen to thirty seconds is adequate for this purpose, though shorter and longer periods may be preferred or necessary depending on the viscosity of the encapsulating material at the dispensing temperature. FIG. 9 shows the encapsulation material as being deposited along a serpentine path 26 that initially crosses the die 10 near its geometric center, and continues in a serpentine manner (i.e., to and fro lateral) toward one edge 22 of the die 10 while completely covering the die 10 and the wires 14 and bond pads 30 located on that side of the die 10. As shown in FIG. 10, the encapsulation material is then deposited on the remaining half of the die 10 and the corresponding wires 14 and bond pads 30, again along a serpentine path 28 that initially crosses near the center of the die 10 and continues in a serpentine manner toward the opposite edge 18 of the die 10. Thereafter, the encapsulation material can be cured in the appropriate manner for the material used.

As shown, the result of this last deposition step (FIG. 10) is that the entire die 10, its wires 14 and the wire bond pads 30 on the surface of the circuit board 12 are completely covered and encapsulated by the encapsulation material, forming the encapsulant 16 depicted in FIG. 1. Importantly, the deposition steps of FIGS. 5 through 10 have been shown to yield an encapsulant 16 that is free of voids. While not wishing to be held to any particular theory, it is believed that the initial dispensing pattern (FIGS. 5 through 8) forces out any air that would become trapped in the gaps between the die 10 and the circuit board 12. By filling these gaps prior to encapsulation of the die 10, wires 14 and bond pads 30, the formation of air pockets (voids) is eliminated. In contrast, prior art deposition techniques (FIGS. 2 through 4) promote the trapping of air because the deposition patterns tend to deposit encapsulating material that collapses on itself, entrapping air in the process.

Figure 2:
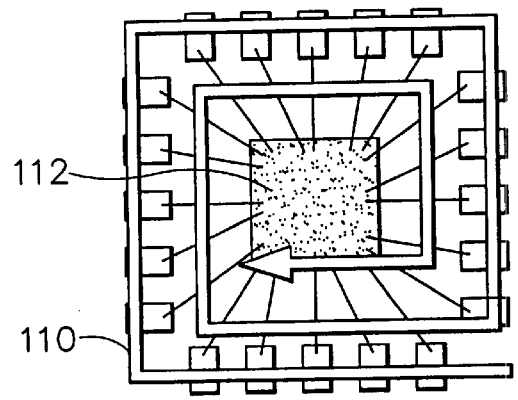
FIGS. 2 through 4 show prior art techniques for dispensing an encapsulation material on a COB.
Figure 3:
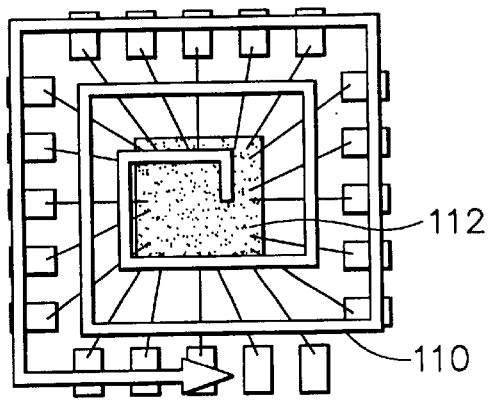
Figure 4:
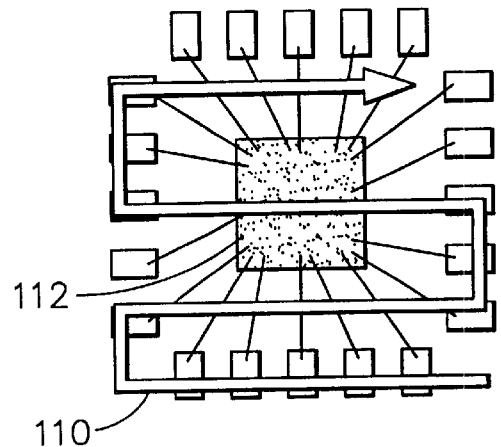

During the course of evaluating this invention, identical COBs were encapsulated according to each of the prior art deposition process depicted in FIGS. 2 through 4, and in accordance the process of this invention shown in FIGS. 5 through 10. The same encapsulating material and deposition conditions were used. Following an identical cure, the COB specimens underwent identical thermal cycling between temperature extremes of −40° C. and +125° C., with the fatigue life of each specimen being defined as the number of cycles completed before a resistance of greater than 50 ohms was detected. The results were that those COBs encapsulated in accordance with this invention exhibited an average thermal cycle fatigue life of about 2800 cycles, with a minimum life of about 2100 cycles. In contrast, those COBs encapsulated in accordance with the prior art method exhibited an average thermal cycle fatigue life of only about 550 cycles, with a maximum life of only about 750 cycles. From these results, it was apparent that the deposition process of the present invention had a profound positive effect on the thermal cycle fatigue life of a wire-bonded IC device.

While our invention has been described in terms of a preferred embodiment, it is apparent that other forms could be adopted by one skilled in the art. For example, it is foreseeable that various encapsulation materials could be used on wire-bond IC devices other than COBs. Accordingly, the scope of our invention is to be limited only by the following claims.

What is claimed is:

1. A method for encapsulating an electronic component wire bonded to a circuit board, the method comprising the steps of:

mounting an electronic component to a circuit board, the component having edges that define a perimeter of the component, the component having bond wires extending radially outward from the edges of the component and electrically connecting the component to the circuit board;

depositing an encapsulation material along a first edge of the component;

depositing the encapsulation material along a second edge of the component, the second edge being contiguous with the first edge;

depositing the encapsulation material along remaining edges of the component until the component is completely surrounded by the encapsulation material, the encapsulation material being deposited sequentially on the remaining edges with each of the remaining edges on which the encapsulation material is deposited being contiguous with an immediately preceding edge on which the encapsulation was previously deposited;

depositing the encapsulation material along a first serpentine path that initially crosses near a center of the component and continues toward one of the edges of the component; and then depositing the encapsulation material along a second serpentine path that initially crosses near the center of the component and continues toward another of the edges of the component opposite the one edge of the component.

2. A method as recited in claim 1, wherein the encapsulation material is a one-part epoxy.

3. A method as recited in claim 1, wherein the component is a chip-on-board die.

4. A method as recited in claim 1, further comprising the step of allowing the encapsulation material to flow between the bond wires prior to depositing the encapsulation material along the first and second serpentine paths.

5. A method as recited in claim 1, further comprising the step of curing the encapsulation material after depositing the encapsulation material along the first and second serpentine paths.

6. A method as recited in claim 1, wherein the encapsulation material is free of voids after depositing the encapsulation material along the first and second serpentine paths.

7. A method as recited in claim 1, wherein the encapsulation material completely encapsulates the component and the bond wires.

8. A method for encapsulating a chip-on-board integrated circuit die wire bonded to a circuit board, the method comprising the steps of:

adhering a chip-on-board integrated circuit die to a circuit board, the die having four edges that define a perimeter of the die, the die having bond wires extending radially outward from the edges of the die and electrically connecting the die to bond pads on the circuit board;

depositing an encapsulation material along a first edge of the die, then along a second edge of the die that is contiguous with the first edge, then along a third edge of the die that is contiguous with the second edge, then along a fourth edge of the die that is contiguous with the first and third edges;

allowing the encapsulation material to settle and flow between the bond wires;

depositing the encapsulation material along a first serpentine path that initially crosses the die near a center of the die and continues toward one of the edges of the die;

depositing the encapsulation material along a second serpentine path that initially crosses near the center of the die and continues toward another of the edges of the die opposite the one edge of the die; and then curing the encapsulation material;

wherein the encapsulation material completely encapsulates the die, the bond wires and the bond pads, and wherein the encapsulation material is free of voids.

9. A method as recited in claim 8, wherein the encapsulation material is a one-part epoxy.

* * * * *